United States Patent
Nakagawa et al.

(10) Patent No.: US 10,451,490 B2
(45) Date of Patent: Oct. 22, 2019

(54) SENSOR PACKAGE

(71) Applicant: OMRON Corporation, Kyoto-shi, Kyoto (JP)

(72) Inventors: Shinya Nakagawa, Omihachiman (JP); Masao Shimizu, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 210 days.

(21) Appl. No.: 15/553,195

(22) PCT Filed: Feb. 24, 2016

(86) PCT No.: PCT/JP2016/055444
§ 371 (c)(1),
(2) Date: Aug. 24, 2017

(87) PCT Pub. No.: WO2016/143517
PCT Pub. Date: Sep. 15, 2016

(65) Prior Publication Data
US 2018/0038740 A1 Feb. 8, 2018

(30) Foreign Application Priority Data
Mar. 12, 2015 (JP) .................. 2015-049430

(51) Int. Cl.
*G01K 7/02* (2006.01)
*G01K 7/01* (2006.01)
*G01J 5/12* (2006.01)

(52) U.S. Cl.
CPC .............. *G01K 7/028* (2013.01); *G01J 5/12* (2013.01); *G01K 7/015* (2013.01); *G01K 7/02* (2013.01); *H01L 2924/1461* (2013.01)

(58) Field of Classification Search
CPC .................. H01L 2924/1461; G01K 7/028
(Continued)

(56) References Cited

U.S. PATENT DOCUMENTS 6,203,194 B1  3/2001  Beerwerth et al.
7,898,071 B2 *  3/2011  Bakke ............... B81B 7/0067
                                              257/680
(Continued)

FOREIGN PATENT DOCUMENTS

CN  1250519 A    4/2000
CN  102928106 A  2/2013
(Continued)

OTHER PUBLICATIONS

The Office Action dated Dec. 4, 2018 in a counterpart Chinese patent application.
(Continued)

*Primary Examiner* — Gail Kaplan Verbitsky
(74) *Attorney, Agent, or Firm* — Metrolex IP Law Group, PLLC

(57) ABSTRACT

Provided is a sensor package that measures an internal temperature of a measurement object. A sensor package includes: a package including a bottomed tubular casing and plural leads substantially parallel to each other, each of the leads piercing the bottomed tubular casing; and a MEMS chip including at least one thermopile that measures a temperature difference in an identical direction. The MEMS chip is disposed in an inner bottom surface of the bottomed tubular casing of the package in a posture in which a measurement direction of the temperature difference measured with the thermopile is substantially orthogonal to a longitudinal direction of each lead.

8 Claims, 7 Drawing Sheets

(58) Field of Classification Search
USPC ..... 374/178, 170, 179, 208, 121; 438/64, 55
See application file for complete search history.

(56) References Cited

U.S. PATENT DOCUMENTS

| | | | | |
|---|---|---|---|---|
| 8,866,237 | B2* | 10/2014 | Manack | B81C 1/00246 257/414 |
| 10,129,656 | B2* | 11/2018 | Buccafusca | H04R 17/02 |
| 10,266,392 | B2* | 4/2019 | Najafi | B81B 7/0064 |
| 2006/0138615 | A1* | 6/2006 | Sato | H01L 23/49548 257/666 |
| 2008/0262773 | A1 | 10/2008 | Howell | |
| 2009/0230520 | A1* | 9/2009 | Lee | H01L 23/4951 257/666 |
| 2010/0195851 | A1* | 8/2010 | Buccafusca | H04R 17/02 381/190 |
| 2013/0276544 | A1* | 10/2013 | Potasek | B81B 7/0048 73/715 |
| 2014/0117473 | A1* | 5/2014 | Kierse | H01L 29/84 257/416 |
| 2014/0179064 | A1* | 6/2014 | Romig | H01L 23/3107 438/118 |
| 2015/0010040 | A1 | 1/2015 | Ito et al. | |
| 2015/0137304 | A1* | 5/2015 | Mao | G01J 5/022 257/467 |
| 2016/0138976 | A1 | 5/2016 | Schilz et al. | |
| 2016/0159641 | A1* | 6/2016 | Najafi | B81B 7/0064 257/467 |
| 2016/0163942 | A1* | 6/2016 | Emadi | H01L 35/02 257/467 |
| 2016/0216163 | A1* | 7/2016 | Lin | G01N 25/4893 |
| 2016/0305829 | A1* | 10/2016 | Emadi | G01J 5/0881 |
| 2017/0113922 | A1* | 4/2017 | Huang | B81B 7/0067 |
| 2017/0194545 | A1* | 7/2017 | de Rochemont | B64D 15/12 |
| 2019/0027522 | A1* | 1/2019 | Kropelnicki | G01J 5/048 |

FOREIGN PATENT DOCUMENTS

| | | |
|---|---|---|
| CN | 104111117 A | 10/2014 |
| JP | 2002-372464 A | 12/2002 |
| JP | 2007-212407 A | 8/2007 |
| WO | 2013141153 A1 | 9/2013 |

OTHER PUBLICATIONS

English translation of Written Opinion of PCT/JP2016/055444 dated Mar. 22, 2016.
The International Search Report of PCT/JP2016/055444 dated Mar. 22, 2016.

* cited by examiner

SENSOR PACKAGE

TECHNICAL FIELD

The present invention relates to a sensor package in which a MEMS chip including at least one thermopile is disposed in a package.

BACKGROUND ART

Conventionally, methods in which a sensor module having a configuration in FIG. 11A is used (for example, see PTL 1) and a method in which a sensor module having a configuration in FIG. 11B is used (for example, see PTL 2) are known as a method for detecting a heat flow flowing out from a body surface and measuring (calculating) a core body temperature from a detection result.

For use of one sensor module in FIG. 11A, namely, a heat flux sensor in which a temperature sensor is attached to each of top and bottom surfaces of a heat insulator, a core body temperature Tb is calculated using the following equation (1) from a temperature Ta measured with the temperature sensor on the top side of the heat insulator and a temperature Tt measured with the temperature sensor on the bottom side of the heat insulator.

$$Tb=(Tt-Ta)Rx/R1+Tt \quad (1)$$

Where R1 and Rx are a heat resistance of a heat insulator and a heat resistance of a subcutaneous tissue, respectively.

In the internal temperature calculating method in which the sensor module in FIG. 11A is used, basically fixed values are used as the heat resistances R1 and Rx. However, because the heat resistance Rx depends on a location or an individual, a measurement error is included in the core body temperature Tb, which is calculated from the equation (1) using the fixed value as the heat resistance Rx, according to a difference between the heat resistance Rx used and the actual heat resistance Rx. Therefore, sometimes time changes of the temperatures Tt and Ta are measured, and the heat resistance Rx is calculated from the measurement result (see PTL 1).

In the case that an internal temperature is calculated with the sensor module in FIG. 11B, a temperature difference expressing a heat flux from the body surface is measured with each of two heat flux sensors having different heat resistances of the heat insulators. The following two equations can be obtained when the temperature difference is measured with the two heat flux sensors having different heat resistances of the heat insulators.

$$Tb=(Tt-Ta)Rx/R1+Tt \quad (2)$$

$$Tb=(Tt'-Ta')Rx/R2+Tt' \quad (3)$$

Where Ta and Ta' are temperatures measured with the temperature sensors on the top sides of the right and left heat flux sensors in FIG. 11B. Where Tt and Tt' are temperatures measured with the temperature sensors on the bottom sides of the right and left heat flux sensors in FIG. 11B. R1 and R2 are heat resistances of heat insulators of the heat flux sensors as illustrated in FIG. 11B.

In the case that R1 and R2 are known numbers, only Rx and Tb are unknown numbers in the equation (2). Accordingly, the core body temperature Tb can be obtained from the equations (2) and (3).

In the case that the internal temperature is calculated using the sensor module in FIG. 11B, the core body temperature Tb is measured (calculated) by the principle.

PRIOR ART DOCUMENTS

Patent Documents

Patent Document 1: Japanese Unexamined Patent Publication No. 2002-372464
Patent Document 2: Japanese Unexamined Patent Publication No. 2007-212407

SUMMARY OF THE INVENTION

Problems to be Solved by the Invention

In the sensor modules in FIGS. 11A and 11B, information necessary for the calculation of the core body temperature Tb is obtained with plural temperature sensors. Because the temperature sensor does not have so high accuracy, the heat insulator having the high heat resistance and heat capacity is used in the sensor modules of FIGS. 11A and 11B. Therefore, the sensor modules have poor responsiveness (it takes a long time to obtain a stable measurement result of the core body temperature).

When a MEMS chip including a thermopile is used in the measurement of the temperature difference, the core body temperature can be measured with good responsiveness because of large decreases in heat resistance and heat capacity of the sensor module that measures the core body temperature. Therefore, an internal temperature measuring apparatus in which the MEMS chip is used is being developed. However, the internal temperature measuring apparatus that can accurately measure (calculate) the internal temperature, such as the core body temperature, which is of a measurement object, is hardly produced because the MEMS chip is an extremely small device susceptible to an ambient temperature.

An object of the present invention is to provide a technology of being able to make an internal temperature measuring apparatus that can accurately measure (calculate) the internal temperature of the measurement object.

Means for Solving the Problem

According to a first aspect of the present invention, a sensor package is obtained by packaging an MEMS chip including at least one thermopile. The sensor package includes: a package including a bottomed tubular casing and plural leads substantially parallel to each other, each of the leads piercing the bottomed tubular casing; and a MEMS chip including one thermopile that measures a temperature difference in a predetermined direction or plural thermopiles each of which measures a temperature difference in an identical direction. The MEMS chip is disposed in an inner bottom surface of the bottomed tubular casing of the package in a posture in which a measurement direction of the temperature difference measured with the one thermopile or the plural thermopiles is substantially orthogonal to a longitudinal direction of each lead of the package.

When the MEMS chip is packaged, the extremely small MEMS chip can easily be handled. However, when the MEMS chip is simply packaged, the measurement accuracy of the temperature difference measured with each thermopile of the MEMS chip is degraded due to an influence of inflow heat through the plural leads provided in the package. On the other hand, when the MEMS chip is disposed in an inner bottom surface of the bottomed tubular casing of the package in a posture in which a measurement direction of the temperature difference measured with the one thermopile or the plural thermopiles is substantially orthogonal to a longitudinal direction of each lead of the package, the degradation of the measurement accuracy of the temperature difference measured with each thermopile of the MEMS chip due to the influence of the inflow heat through the plural leads can be prevented. Accordingly, use of the sensor package of the first aspect of the present invention can construct the internal temperature measuring apparatus that can accurately measure (calculate) the internal temperature of the measurement object, an infrared detection apparatus that can accurately detect whether an infrared ray is incident on the MEMS chip from a detection result of the temperature difference measured with the thermopile, or a non-contact temperature measuring apparatus that can accurately detect temperature at a generation source of the infrared ray from the detection result of the temperature difference measured with the thermopile.

The bottomed tubular casing in the package may be a casing including a bottom having shapes such as a bottomed cylindrical shape, a bottomed elliptical tube shape, and a bottomed rectangular tube shape and a sidewall surrounding the bottom. The sensor package can be constructed in various forms. In the sensor package of the first aspect of the present invention, the bottom of the bottomed tubular casing of the package may include a non-heat transfer portion and a heat transfer portion made of a material (for example, metal) having heat conductivity better than that of a constituent material of the non-heat transfer portion, and at least a part of the MEMS chip may be located on the heat transfer portion.

In the sensor package of the first aspect of the present invention, at a leading end outside the bottomed tubular casing of the plural leads, surfaces oriented toward an identical direction may be located on an identical plane. At the leading end outside the bottomed tubular casing of the plural leads (the plural leading ends outside the bottomed tubular casing of the plural leads), the surfaces oriented toward the identical direction mean surfaces oriented toward the inner bottom surface side (the side of a plane including the inner bottom surface of the package) or an opposite side of the package. When the above configuration is adopted, surface mounting of the sensor package can be performed.

The package of the sensor package of the first aspect of the present invention may be formed (produced) by any method. In particular, when the package is formed by mold forming (insert forming), the sensor package can easily be obtained (with a small number of processes).

In order that light incident from above is prevented from being incident on the MEMS chip after reflection by an inner surface of the sensor package, or in order to stabilize temperature of air in the sensor package, the inner surface of a package casing (the bottomed tubular casing of the package) of the sensor package may be coated with a black material.

In the sensor package of the first aspect of the present invention, the MEMS chip may include a top face including the one or plural thermopiles and a support that supports the top face with respect to the inner bottom surface of the bottomed tubular casing of the package, the support including at least one cavity leading to the top face, the MEMS chip may be fixed to the inner bottom surface of the bottomed tubular casing of the package using an adhesive material such that at least one first region and at least one second region exist in a surface of the support on a side opposite to the inner bottom surface of the bottomed tubular casing of the package, the first region being fixed to the inner bottom surface using the adhesive material, the second region being not fixed to the inner bottom surface using the adhesive material, and such that hot junctions of plural thermocouples constituting each thermopile are located in the at least one first region when viewed from an array direction of the MEMS chip and a bottom of the bottomed tubular casing of the package. When the above configuration is adopted, breakage of a membrane (in the top face, a portion located above the cavity) due to an increase in pressure of air in the cavity can be prevented without degrading performance.

According to a second aspect of the present invention, a sensor package includes: a bottomed tubular package including plural leads; and a MEMS chip including one thermopile that measures a temperature difference in a predetermined direction or plural thermopiles each of which measures a temperature difference in an identical direction. The MEMS chip is disposed in an inner bottom surface of the bottomed tubular package in a posture in which a measurement direction of the temperature difference measured with the one thermopile or the plural thermopiles becomes a direction in which two portions in an inside face of the package are connected to each other, an amount of temperature rise caused by inflow of heat from the plural leads in the two portions being less than that in other portions.

In the above configuration, the degradation of the measurement accuracy of the temperature difference measured with each thermopile of the MEMS chip due to the influence of the inflow heat through the plural leads can also be prevented. Accordingly, the sensor package of the second aspect of the present invention can also construct the internal temperature measuring apparatus that can accurately measure (calculate) an internal temperature of the measurement object, an infrared detection apparatus that can accurately detect whether an infrared ray is incident on the MEMS chip from a detection result of the temperature difference measured with the thermopile, or a non-contact temperature measuring apparatus that can accurately detect temperature at a generation source of the infrared ray from the detection result of the temperature difference measured with the thermopile.

In the sensor package of the second aspect of the present invention, any portion may be used as the two portions in an inside face of the package, in which an amount of temperature rise caused by inflow of heat from the plurality of leads in the two portions is less than that in other portions as long as the amount of temperature rise is close to the minimum.

Effect of the Invention

Accordingly, the present invention can make the internal temperature measuring apparatus that can accurately measure (calculate) the internal temperature of the measurement object, and the infrared detection apparatus that can accurately detect whether the infrared ray is incident on the MEMS chip from the detection result of the temperature difference measured with the thermopile.

MODE FOR CARRYING OUT THE INVENTION

Hereinafter, an embodiment of the present invention will be described with reference to the drawings.

Figure 1:
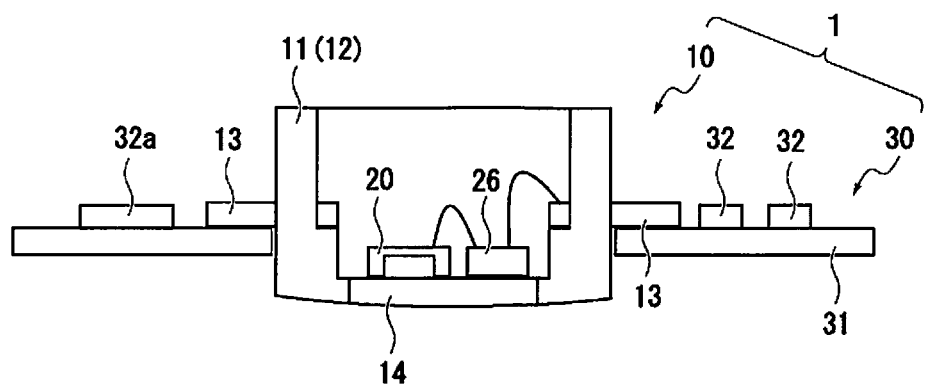
FIG. 1 is a schematic configuration diagram illustrating an internal temperature measuring apparatus produced using a sensor package according to an embodiment of the present invention.

FIG. 1 illustrates a schematic configuration of an internal temperature measuring apparatus 1 in which a sensor package 10 according to an embodiment of the present invention is used.

As illustrated in FIG. 1, the internal temperature measuring apparatus 1 includes the sensor package 10 and a printed circuit board 30.

The printed circuit board 30 is a unit in which various devices 32 (such as a resistor and a capacitor) including an arithmetic circuit 32a are mounted on a printed wiring board 31. The arithmetic circuit 32a calculates the internal temperature of a measurement object from measurement results of a temperature difference and a temperature with the sensor package 10 (a MEMS chip 20 and an ASIC 26 (to be described later)), and outputs the internal temperature.

As illustrated in FIG. 1, a through-hole is made in the printed wiring board 31 of the printed circuit board 30 to insert the sensor package 10.

The sensor package 10 is a module that measures a value (a temperature and at least one temperature difference) necessary for the calculation of the internal temperature. The internal temperature measuring apparatus 1 is used while a bottom surface (a surface on a lower side in FIG. 1) of the sensor package 10 is brought into contact with a surface of the measurement object (such as a human body) of the internal temperature.

As illustrated in FIG. 1, the sensor package 10 includes a package 11, the MEMS chip 20, and the ASIC 26.

The package 11 is a case for the MEMS chip 20 and the ASIC 26. The package 11 has a shape in which plural leads 13 project from two side faces located on the opposite sides from each other.

Figure 2:
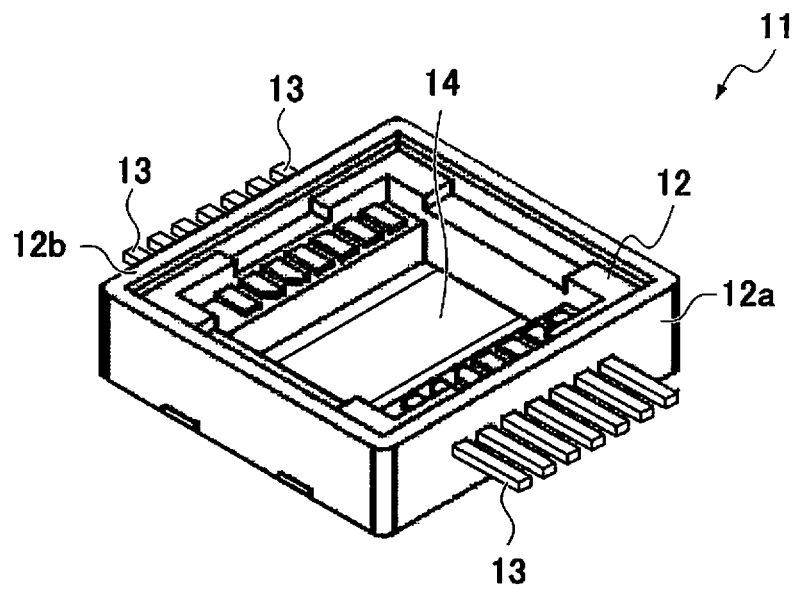
FIG. 2 is a perspective view illustrating a package of the sensor package of the embodiment.

More specifically, as illustrated in FIG. 2, the package 11 includes a casing 12 having a substantially bottomed square tube shape. In the casing 12 of the package 11, plural leads 13 are provided in each of sidewalls 12a and 12b located on the opposite sides from each other while piercing each of the sidewalls 12a and 12b with a predetermined interval from the bottom surface of the casing 12. The interval between each lead 13 and the bottom surface of the casing 12 is fixed such that the bottom surface of the sensor package 10 projects from the bottom surface of the printed circuit board 30 (printed wiring board 31) when the bottom side of the sensor package 10 is inserted in the through-hole of the printed wiring board 31.

A heat transfer pad 14 made of a high heat conductive material (in the embodiment, metal) is provided in the bottom of the casing 12.

An insulating material having poor heat conductivity may be used as a constituent material of each sidewall of the casing 12. In the bottom of the casing 12, preferably a material having the poor heat conductivity is used as a constituent material of a portion except for the heat transfer pad 14. However, a material having the good heat conductivity may be used as the constituent material of the portion except for the heat transfer pad 14.

Figure 3:
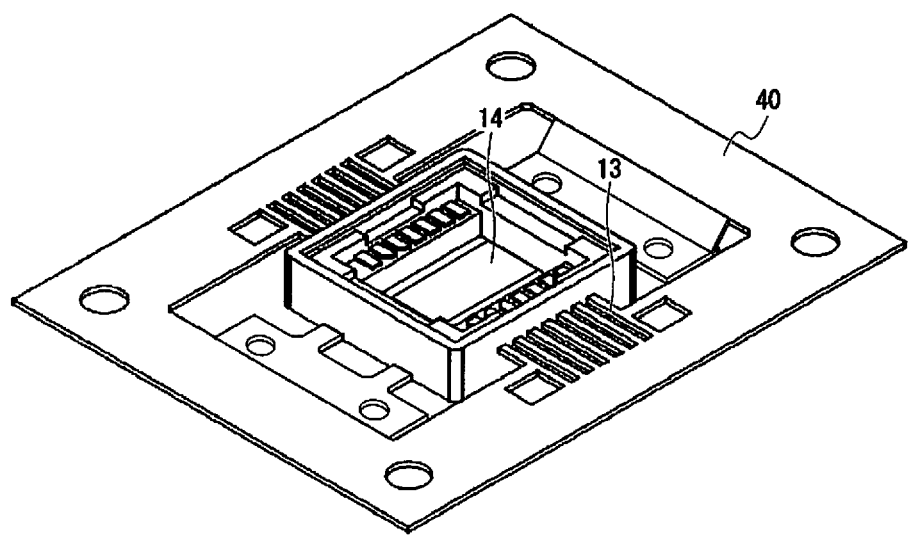
FIG. 3 is an explanatory diagram illustrating a method for producing the package by mold forming.

In the casing 12, when the constituent material of the portion except for the heat transfer pad 14 is made of resin, the package 11 can easily be produced by mold forming (insert forming) using a metallic plate 40 having a shape in FIG. 3, namely, a metallic plate 40 including a portion constituting the lead 13 and a portion constituting the metallic plate 14. Accordingly, in the casing 12, the constituent material except for the heat transfer pad 14 is preferably made of resin.

The ASIC 26 (FIG. 1) is an integrated circuit in which plural input and output electrodes are provided on the top surface of the integrated circuit. The ASIC 26 includes a temperature sensor to measure temperature used as temperature at a predetermined portion of the MEMS chip 20. The ASIC 26 has a function of amplifying output of the temperature sensor and output of the MEMS chip 20 and a function of digitizing each amplified output. For example, an integrated circuit including a proportional to absolute temperature (PTAT) voltage source that outputs voltage proportional to an absolute temperature (that is, a voltage source acting as a thermometer) can be used as the ASIC 26, a component of the PTAT voltage source acting as a temperature sensor.

The MEMS chip 20 used as the component of the sensor package 10 includes one thermopile or plural thermopiles each of which measures the temperature difference in the identical direction.

Figure 4A:
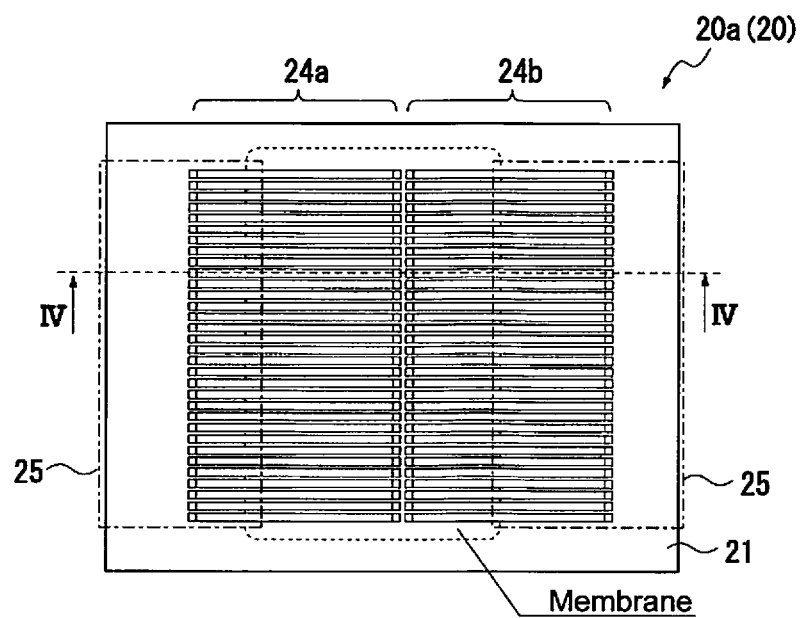
FIG. 4A is a top view illustrating a MEMS chip including plural thermopiles each of which measures a temperature difference in an identical direction.
Figure 4B:
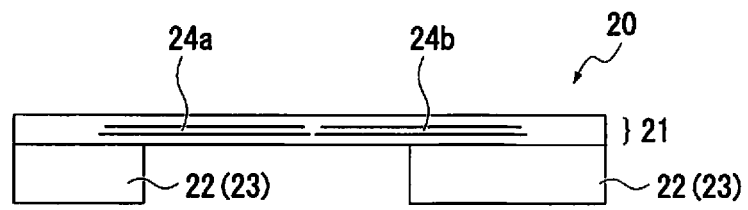
FIG. 4B is a sectional view taken on line IV-IV of the MEMS chip in FIG. 4A.
Figure 5A:
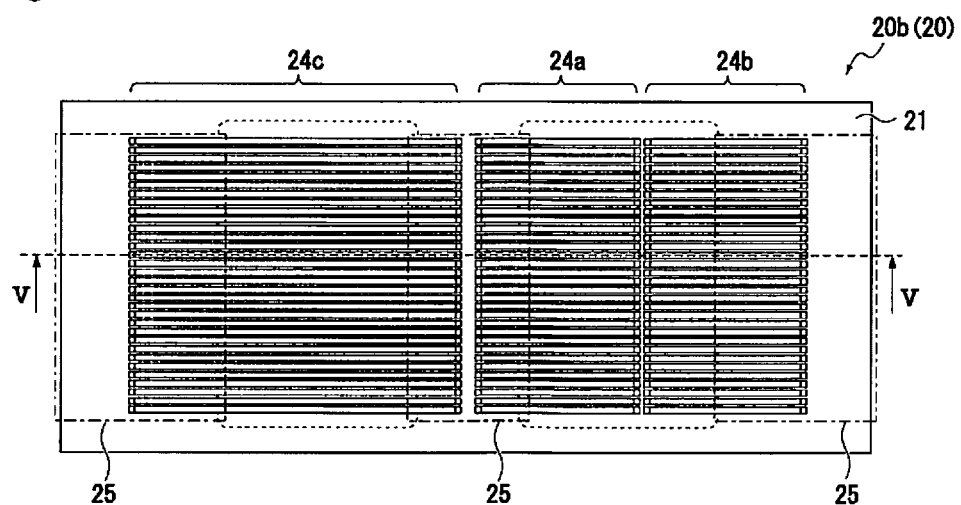
FIG. 5A is a top view illustrating another MEMS chip including plural thermopiles each of which measures the temperature difference in the identical direction.

A configuration example of the MEMS chip 20 (20a and 20b) including the plural thermopiles each of which measures the temperature difference in the identical direction will be described below with reference to FIGS. 4A, 4B, 5A, and 5B. Hereinafter, in the description of the MEMS chips 20a and 20b, the top, the bottom, the right, and the left mean the top, the bottom, the right, and the left in FIGS. 4B and 5B. FIG. 4A is a top view illustrating the MEMS chip 20a including two thermopiles 24a and 24b each of which measures the temperature difference in the identical direction (horizontal direction), and FIG. 4B is a sectional view taken on line IV-IV of the MEMS chip 20a in FIG. 4A. FIG. 5A is a top view illustrating the MEMS chip 20b including three thermopiles 24a to 24c each of which measures the temperature difference in the identical direction (horizontal direction), and FIG. 5B is a sectional view taken on line V-V of the MEMS chip 20b in FIG. 5A.

Figure 5B:
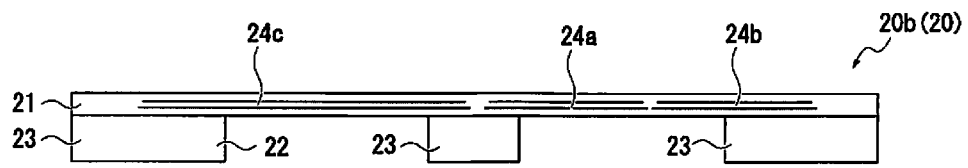
FIG. 5B is a sectional view taken on line V-V of the MEMS chip in FIG. 5A.

As illustrated in FIGS. 4B and 5B, the MEMS chip 20 (20a and 20b) includes a top face 21 and a support 22. The top face 21 has a layered structure formed on a silicon substrate through semiconductor processes. As illustrated in FIGS. 4A and 4B, thermopiles 24a and 24b in each of which thermocouples are connected in series are provided in the top face 21 of the MEMS chip 20a. As illustrated in FIGS. 5A and 5B, thermopiles 24a to 24c are provided in the top face 21 of the MEMS chip 20b. Although not illustrated, an electrode of each thermopile 24 is provided in an upper surface of the top face 21 of each of the MEMS chips 20a and 20b.

The support 22 is formed by etching of the silicon substrate on which the top face 21 is formed from a backside. As illustrated in FIGS. 4B and 5B, the support 22 includes at least one cavity leasing to the top face 21. Hereinafter, in the top face 21, a portion located above each cavity of the support 22 is referred to as a membrane (see FIG. 4A). In the support 22, a portion in a frame 25 indicated by an alternate long and short dash line in FIGS. 4A and 5A, namely, a portion of the support 22 located below the portion of the top face 21 that becomes a temperature measurement target with the thermopile 24 is referred to as a leg 23.

Like the MEMS chips 20a and 20b, the MEMS chip 20 used as the component of the sensor package 10 includes the plural thermopiles each of which measures the temperature difference in the identical direction (hereinafter, referred to as a temperature difference measuring direction), or includes one thermopile that measures the temperature difference in a direction (hereinafter, referred to as the temperature difference measuring direction).

In the sensor package 10 of the embodiment, the ASIC 26 and the MEMS chip 20 having the above configuration are fixed onto the heat transfer pad 14 of the package 11, the MEMS chip 20 is electrically connected to the ASIC 26 by wire bonding, and the lead 13 is electrically connected to the ASIC 26 by wire bonding (see FIG. 1).

Figure 6:
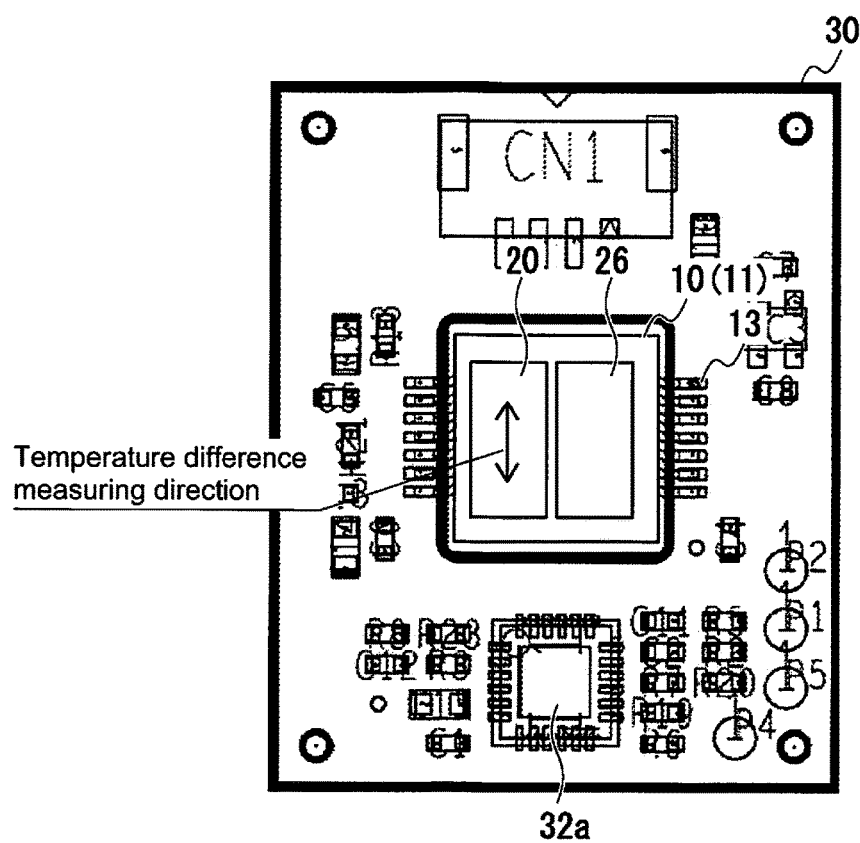
FIG. 6 is an explanatory diagram illustrating a positional relationship between a temperature difference measuring direction of the MEMS chip and a lead of the package.

However, in the sensor package 10, as schematically illustrated in FIG. 6, the MEMS chip 20 is disposed in the package 11 such that the temperature difference measuring direction of the MEMS chip 20 is substantially orthogonal to a longitudinal direction of each lead 13 of the package 11.

The reason the above configuration is adopted in the sensor package 10 will be described below.

The plural leads 13 are provided in the sidewalls 12a and 12b of the package 11 (see FIG. 2) of the sensor package 10, any leads 13 are not provided in the remaining two sidewalls.

The lead 13 is a high heat conductive material because the lead 13 is an electrically conductive material. Accordingly, heat flows easily in the sidewalls 12a and 12b of the package 11 provided with the leads 13 through the leads 13, and temperature rises easily in the sidewalls 12a and 12b compared with other sidewalls. Usually the sidewall 12a differs from the sidewall 12b in an amount of temperature rise generated by the inflow of the heat through the leads 13. The temperature difference measured with the thermopile 24 of the MEMS chip 20 is extremely small.

Therefore, in the case that the MEMS chip 20 is disposed such that the temperature difference measuring direction is orthogonal to the sidewalls 12a and 12b, sometimes the temperature difference measured with some thermopiles 24 of the MEMS chip 20 includes a relatively large error caused by the temperature rise of the sidewall 12a and/or 12b.

On the other hand, when the MEMS chip 20 is disposed such that the temperature difference measuring direction is substantially orthogonal to the longitudinal direction of each lead, the error can be prevented from being included in the temperature difference measured with the thermopile 24. This is because the above configuration is adopted in the sensor package 10 of the embodiment.

Some descriptions about the sensor package 10 will be supplemented below.

Usually the MEMS chip 20 is fixed onto the heat transfer pad 14 using a good heat conductive adhesive such as a silver paste. At this point, the whole bottom surface of the MEMS chip 20 may be fixed onto the heat transfer pad 14 using the silver paste or the like. However, in such cases, because the cavity below the membrane becomes a closed space, a pressure of air in the cavity is increased by temperature rise, and possibly the membrane is broken.

Figure 7:
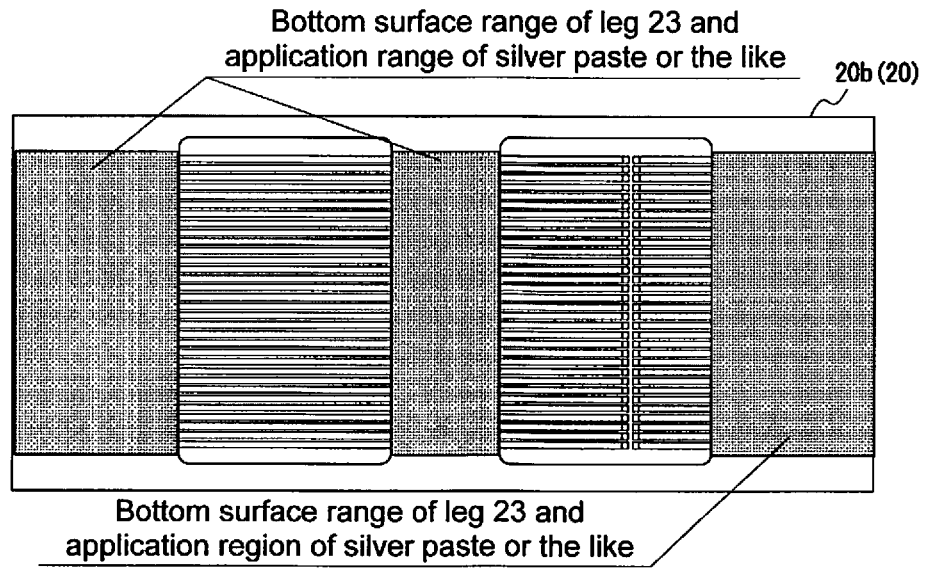
FIG. 7 is an explanatory diagram illustrating a method for fixing the MEMS chip to the package.

Preferably the MEMS chip 20 is fixed onto the heat transfer pad 14 such that each cavity does not become the closed space. However, when poor heat conductive portion exists between a leg 23 and a heat transfer pad 14, an error is included in the temperature difference measured with the thermopile 24 in which a hot junction exists on the leg 23. As schematically illustrated in FIG. 7, when the MEMS chip 20 is fixed onto the heat transfer pad 14 while the silver paste is applied only to the whole bottom surface of each leg 23 of the MEMS chip 20, the occurrence of the breakage of the membrane due to the pressure increase of air in the cavity can be suppressed without degrading performance of the MEMS chip 20. FIG. 7 is a plan view illustrating the MEMS chip 20b in FIG. 5 when the MEMS chip 20b is viewed from the bottom surface side.

Accordingly, in producing (assembling) the sensor package 10, preferably the silver paste is applied only to the whole bottom surface of each leg 23 of the MEMS chip 20, and the MEMS chip 20 is fixed onto the heat transfer pad 14.

Figure 8:
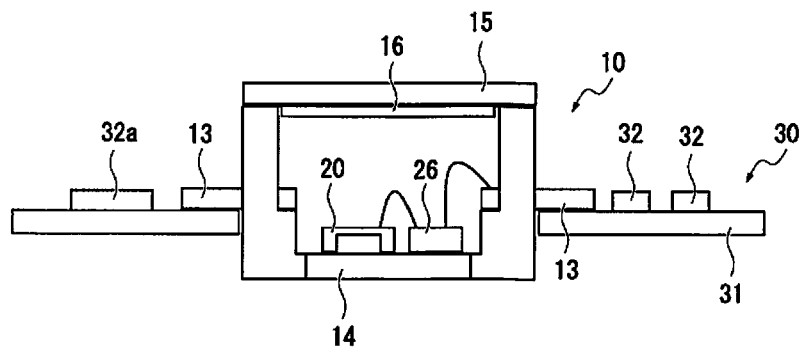
FIG. 8 is an explanatory diagram illustrating a method for using the sensor package of the embodiment.

In the case that a measurement environment is one in which the temperature of the air above the sensor package 10 is stable while light (such as infrared light) is not incident on the sensor package 10 from above, the sensor package 10 can be used in the state of FIG. 1, namely, the state in which the top of the sensor package 10 is not sealed. However, such a measurement environment occurs rarely. The measurement accuracy of the temperature difference is degraded in the case that the light is incident on the sensor package 10 from above, or in the case that the temperature of the air above the sensor package 10 changes. Therefore, as schematically illustrated in FIG. 8, the sensor package 10 is usually used while an opening (top surface) of the sensor package 10 is covered with a lid 15 larger than the opening.

The sensor package 10 is a module in which sensitivity becomes higher with decreasing air temperature above the sensor package 10. Accordingly, as illustrated in FIG. 8, a member 16 absorbing infrared light may be provided on the bottom surface of the lid 15 in the case that the opening of the sensor package 10 is covered with the lid 15. A member formed into a shape having good heat dissipation, for example, a member including a radiation fin, or a member having an area several times larger than the size of the opening of the sensor package 10 may be used as the lid 15 of the sensor package 10.

Figure 9:
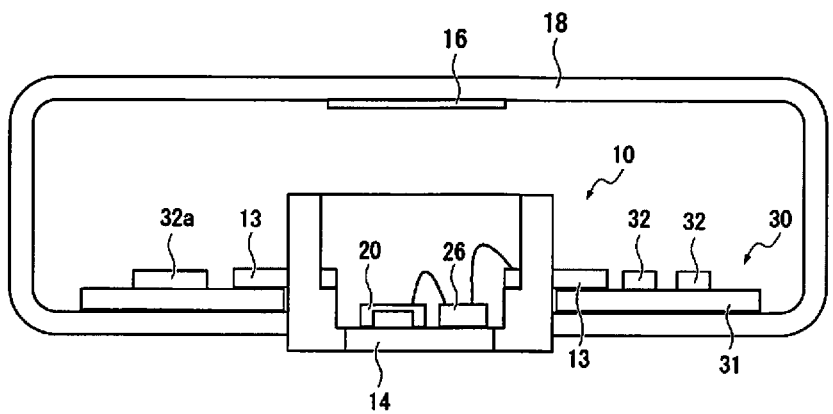
FIG. 9 is an explanatory diagram illustrating a method for using the sensor package of the embodiment.

As schematically illustrated in FIG. 9, a portion except for the bottom surface of the sensor package 10 may be surrounded by a casing 18 without providing the lid 15.

In this case, in the casing 18, a member 16 absorbing infrared light is provided in the portion above the opening of the sensor package 10, which allows improvement of the sensitivity of the internal temperature measuring apparatus.

In order that the light incident from above is prevented from being incident on the MEMS chip 20 after reflection by an inner surface of the sensor package 10, or in order to stabilize the temperature of the air in the sensor package 10, the inner surface of the sensor package 10 (the package 11 and the casing 12) may be coated with a black material such as a black paint and a black resin.

In the case that the sensor package 10 is used to measure the core body temperature of the human body, an insulating film having biocompatibility or a resin member may be fixed to the bottom surface of the sensor package 10. In order to improve thermal contact performance with the measurement object, the sensor package 10 may be made such that the bottom surface of the sensor package 10 is formed into a curved shape in which a central portion is convex downward, or such that plural convex curved structures exist in the bottom surface of the sensor package 10.

MODIFICATIONS

Figure 10A:
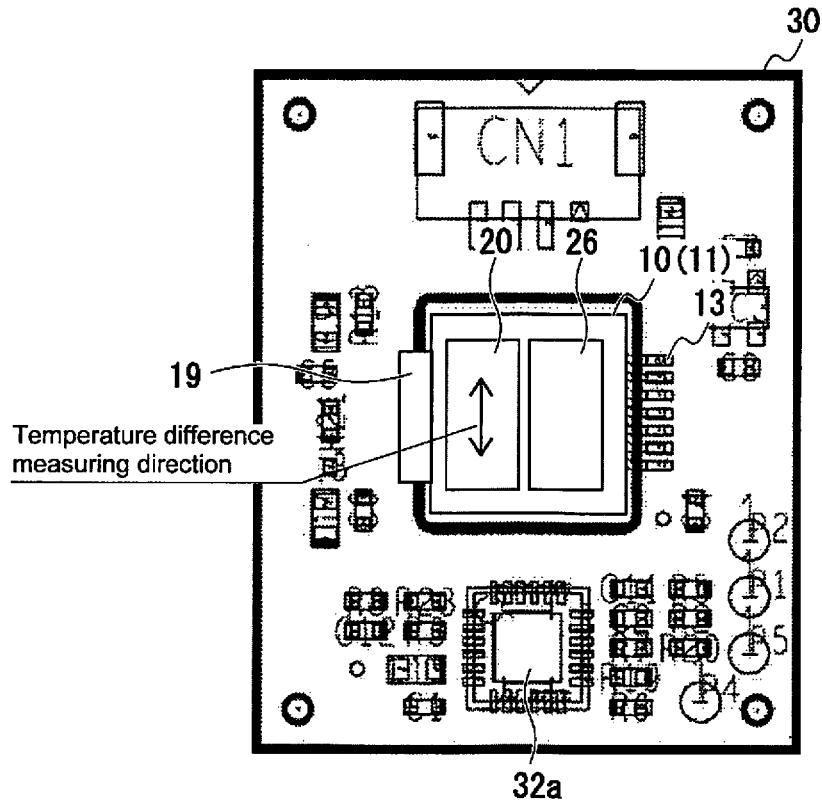
FIG. 10A is an explanatory diagram illustrating a modification of the sensor package of the embodiment.
Figure 10B:
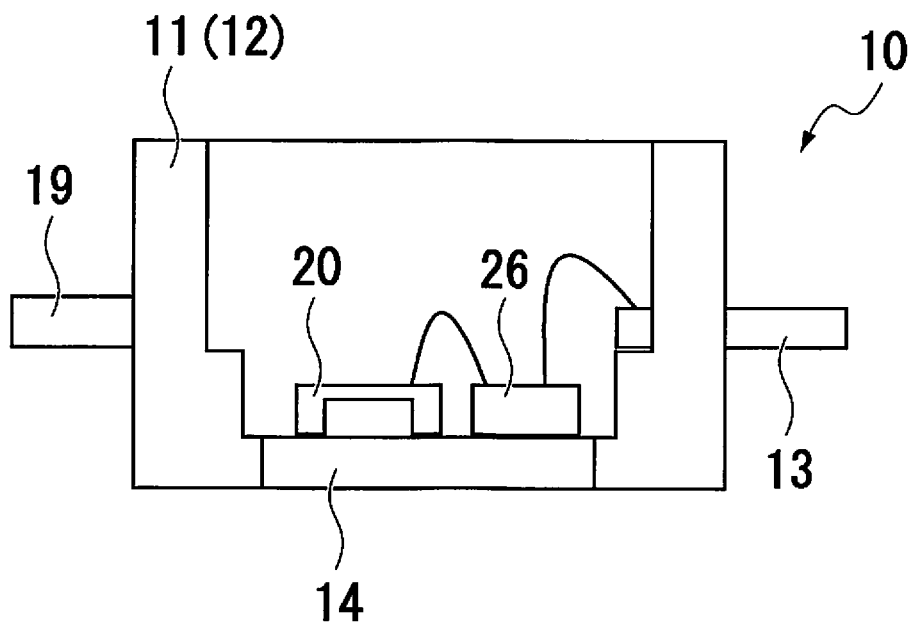
FIG. 10B is an explanatory diagram illustrating a modification of the sensor package of the embodiment.
Figure 11A:
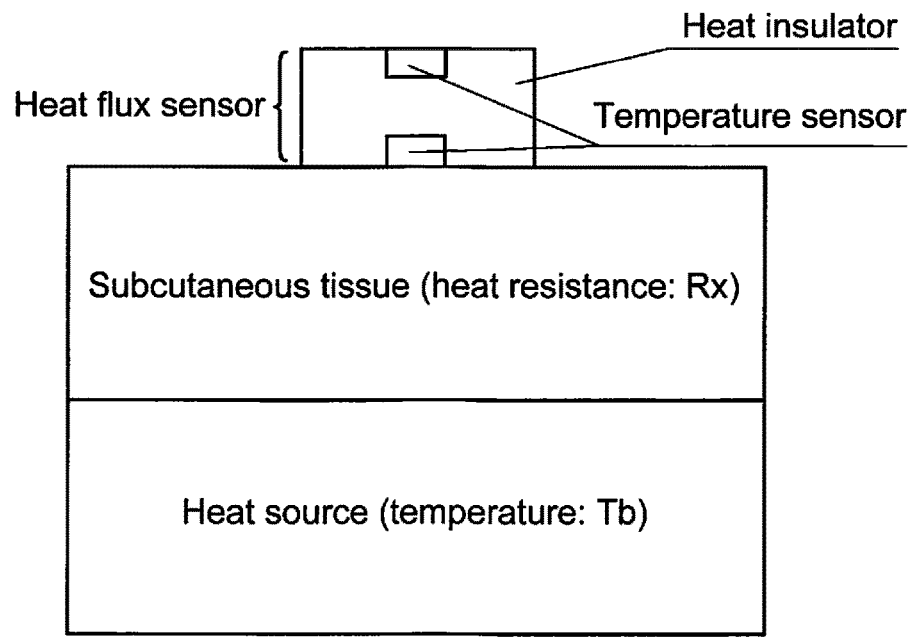
FIG. 11A is an explanatory diagram illustrating a sensor module, which is used to measure a core body temperature, including one heat flux sensor.
Figure 11B:
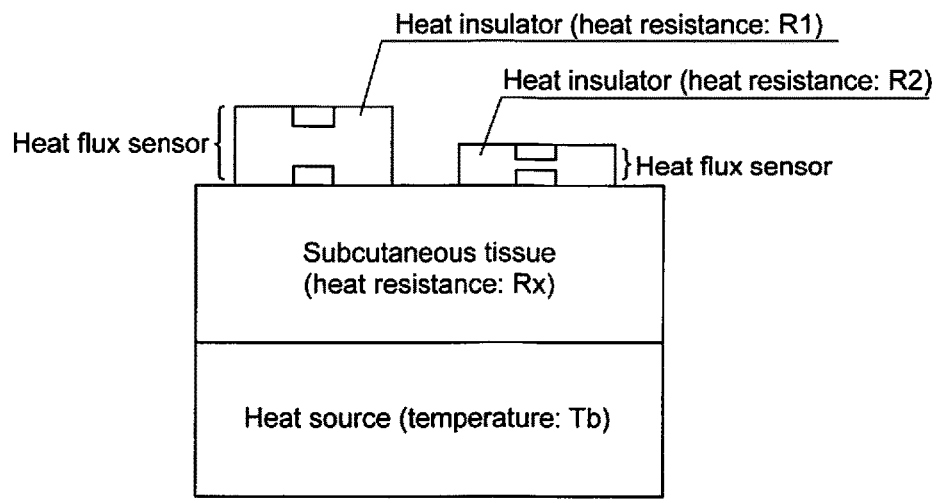
FIG. 11B is an explanatory diagram illustrating a sensor module, which is used to measure a core body temperature, including two heat flux sensors.

Various modifications can be made in the sensor package 10 of the embodiment. For example, as illustrated in FIG. 10A, the package 11 of the sensor package 10 may be modified such that the leads 13 are provided only in one sidewall. In this case, as illustrated in FIG. 10A, the MEMS chip 20 may be disposed such that the temperature difference measuring direction of the MEMS chip 20 is substantially orthogonal to the two sidewalls, which are located opposite from each other while any leads 13 are not provided, in the package 11. However, in this case, as illustrated in FIGS. 10A and 10B, preferably a projection 19 is provided in the sidewall located opposite from the sidewall, in which the leads 13 are provided, in order to surely fix the package 11 (sensor package 10) to the printed circuit board 30.

The technology adopted in the sensor package 10 can also be applied to the package 11 in which casing 12 has a different shape or the package 11 having a different number of sidewalls pierced by the leads 13. For example, in the case that the technology is applied to the package 11 having a bottomed cylindrical shape in which the leads 13 are provided in various directions, two portions in the inside face of the package 11 are fixed from the structure of the package 11, the amount of temperature rise caused by the inflow of the heat from the plural leads 13 being less in the two portions compared with other portions. At this point, the fixed two portions may be a portion in which the amount of temperature rise is close to the minimum (for example, a portion in which the amount of temperature rise becomes 10% or less of the maximum of the amount of temperature rise). The sensor package 10 in which a large error is not generated in the output of the MEMS chip 20 due to the inflow of the heat through the leads 13 can be obtained when the MEMS chip 20 is disposed in the bottom of the package 11 such that the temperature difference measuring direction becomes a direction in which the fixed two portions are connected to each other.

The sensor package 10 is used in the internal temperature measuring apparatus. However, when the position of the cavity of the MEMS chip 20 is changed, the MEMS chip 20 can be used as a sensor of an infrared detection apparatus or a non-contact temperature measuring apparatus. Accordingly, the sensor package 10 may be modified into a sensor package for the infrared detection apparatus or the non-contact temperature measuring apparatus.

In the MEMS chip 20 disposed in the sensor package 10, membranes may be arrayed in a direction orthogonal to a temperature measuring direction, or the membranes may be arrayed in a matrix form.

DESCRIPTION OF SYMBOLS 10 sensor package
11 package
12, 18 casing
12a, 12b sidewall
13 lead
14 heat transfer pad
15 lid
20 MEMS chip
21 top face
22 support
23 leg
24, 24a, 24b, 24c thermopile
26 ASIC
30 printed circuit board
31 printed wiring board
32 device
32a arithmetic circuit

The invention claimed is:

1. A sensor package comprising:
 a package comprising a bottomed tubular casing and a plurality of leads substantially parallel to each other, each lead of the plurality of leads piercing the bottomed tubular casing; and
 a MEMS chip comprising: one thermopile that measures a temperature difference in a predetermined direction; or a plurality of thermopiles each of which measures the temperature difference in the predetermined direction,
 wherein the MEMS chip is disposed in an inner bottom surface of the bottomed tubular casing of the package such that a measurement direction of the temperature difference measured with the one thermopile or the plurality of thermopiles is substantially orthogonal to a longitudinal direction of each lead of the plurality of leads of the package.

2. The sensor package according to claim 1, wherein a bottom of the bottomed tubular casing of the package comprises: a non-heat transfer portion; and a heat transfer portion comprising a material having a heat conductivity higher than a heat conductivity of a constituent material of the non-heat transfer portion, and
 at least a part of the MEMS chip is located on the heat transfer portion.

3. The sensor package according to claim 2, wherein the heat transfer portion comprises a metal.

4. The sensor package according to claim 1, wherein, at a leading end of the plurality of leads outside the bottomed tubular casing, surfaces oriented toward an identical direction are located on an identical plane.

5. The sensor package according to claim 1, wherein the package is formed by mold forming.

6. The sensor package according to claim 1, wherein an inner surface of the bottomed tubular casing of the package is coated with a black material.

7. The sensor package according to claim 1, wherein the MEMS chip comprises a top face comprising the one thermopile or the plurality of thermopiles and a support that supports the top face with respect to the inner bottom surface of the bottomed tubular casing of the package, the support comprising at least one cavity leading to the top face, and the MEMS chip is fixed to the inner bottom surface of the bottomed tubular casing of the package using an adhesive material such that at least one first region and at least one second region exist in a surface of the support on a side opposite to the inner bottom surface of the bottomed tubular casing of the package, the first region being fixed to the inner bottom surface using the adhesive material, the second region being not fixed to the inner bottom surface using the adhesive material, and such that hot junctions of the one thermopile or the plurality of thermopiles are located in the at least one first region when viewed from an array direction of the MEMS chip and a bottom of the bottomed tubular casing of the package.

8. A sensor package comprising:
a bottomed tubular package comprising a plurality of leads; and
a MEMS chip comprising: one thermopile that measures a temperature difference in a predetermined direction; or a plurality of thermopiles each of which measures the temperature difference in the predetermined direction,
wherein the MEMS chip is disposed in an inner bottom surface of the bottomed tubular package such that a measurement direction of the temperature difference measured with the one thermopile or the plurality of thermopiles becomes a direction in which two portions in an inside face of the bottomed tubular package are connected to each other, and an amount of temperature rise caused by inflow of heat from the plurality of leads in the two portions is less than an amount of temperature rise in other portions.

* * * * *